United States Patent [19]

Field et al.

[11] Patent Number: 4,546,066

[45] Date of Patent: Oct. 8, 1985

[54] METHOD FOR FORMING NARROW IMAGES ON SEMICONDUCTOR SUBSTRATES

[75] Inventors: Cheryl B. Field, Granite Springs; Russell C. Lange, Wappingers Falls, both of N.Y.

[73] Assignee: International Business Machines Corporation, Armonk, N.Y.

[21] Appl. No.: 536,100

[22] Filed: Sep. 27, 1983

[51] Int. Cl.⁴ .......................... G03C 5/00; G03F 7/26
[52] U.S. Cl. ................................. 430/314; 430/317; 430/323; 430/324; 430/325; 430/328; 430/330
[58] Field of Search ............... 430/313, 314, 317, 323, 430/324, 325, 330, 328

[56] References Cited

U.S. PATENT DOCUMENTS

| | | | |
|---|---|---|---|
| 4,022,932 | 5/1977 | Feng | 427/93 |
| 4,104,070 | 8/1978 | Moritz et al. | 430/329 |
| 4,231,811 | 11/1980 | Somekh et al. | 148/1.5 |
| 4,318,759 | 3/1982 | Trenary et al. | 148/187 |
| 4,508,813 | 4/1985 | Nakagawa | 430/296 |

OTHER PUBLICATIONS

Hamel et al., IBM Technical Disclosure Bulletin, vol. 24, No. 10, Mar. 1982, p. 5063.
Hamel et al., IBM Technical Disclosure Bulletin, vol. 23, No. 5, Oct. 1980, p. 1839.

Primary Examiner—Mary F. Downey
Assistant Examiner—José G. Dees
Attorney, Agent, or Firm—Sughrue, Mion, Zinn, Macpeak, and Seas

[57] ABSTRACT

A method for providing very narrow resolvable line widths on a semiconductor substrate surface involves initial overexposure of a positive working photoresist through a mask so as to not only expose the portions of the photoresist corresponding to the transparent areas of the mask but to also expose the outer periphery of the photoresist areas corresponding to the opaque areas of the mask. Through subsequent processing, the areas of the substrate surface corresponding to the originally unexposed areas of the photoresist are made available for use in semiconductor fabrication, such as areas to be oxidized to function as narrow electrical isolation areas.

6 Claims, 4 Drawing Figures

METHOD FOR FORMING NARROW IMAGES ON SEMICONDUCTOR SUBSTRATES

BACKGROUND OF THE INVENTION

In the fabrication of integrated components on a semiconductor wafer or chip, narrow areas of electrical isolation are provided between device components. Recessed oxide isolation is often employed in semiconductor chips such as memory and logic chips for electrically isolating devices and regions formed on the chips.

Photolithography has been employed in constructing isolation areas of narrow width. However, the minimum resolvable line width in conventional near-UV projection photolithography is of the order or 2 to 3 microns, which provides a wider isolation area than often required for adequate electical isolation in the integrated circuits. In addition, when an exposed area of a semiconductor substrate is oxidized, there is a tendency for the oxide area to laterally expand or grow, to encompass an area of the semiconductor substrate larger than the surface area developed during the photolithographic process. This also contributes to the formation of recessed oxide isolation regions larger than required.

Integrated circuit chips characterized by smaller recessed oxide isolation regions would allow reduction in size of other chip electrical components, provide room for a larger number of active components on a single wafer and the like, all of which, among other benefits, would reduce the overall cost of the integrated circuit and reduce the minimum response times of the integrated circuit elements.

U.S. Pat. No. 4,318,759 by Trinary et al describes a complicated retro-etch process for forming narrow line widths on a semiconductor chip. First and second masking layers are required, and a retro-etched area is formed by partially retro-etching the first masking layer below the second masking layer.

U.S. Pat. No. 4,022,932 by Feng describes a process for reducing the smallest aperture dimensions in a patterned resist mask. A resist mask is placed in a chamber containing an atmosphere of resist solvent vapor which is absorbed by the mask, causing resist reflow, resulting in reduction of the dimensions of the resist openings.

U.S. Pat. No. 4,231,811 by Somekh et al describes a process for producing aligned areas of different thickness in a semiconductor chip by employing a photoresist mask having an area composed of a plurality of spaced-apart lines of predetermined width, such that the images of the lines cannot be resolved by the projection means employed. The photosensitive material receives light of intermediate intensity compared to the light associated with transparent and opaque areas of the masking member. Upon developing, areas of different thickness are formed.

U.S. Pat. No. 4,104,070 by Moritz et al describes a process for making a negative photoresist image using a positive working photoresist material containing a 1-hydroxyethyl-2-alkylimidazoline. The process of Moritz et al will be considered in greater detail in the "Detailed Description of the Invention", hereinafter. IBM Technical Disclosure Bulletins, Volume 24, No. 10, March 1982 and Volume 23, No. 5, October 1980, describe modified positive working photoresists providing, where desired, negative images on a substrate. The processes of Moritz et al and of the IBM TDB's are stated to provide better resolution and less defects than the use of other negative working photoresist materials. In addition, Moritz in an internal report not publicly available, said report being dated prior to the work of the present inventors disclosed herein but as far as known reviewed by the present inventors after they had completed their invention disclosed herein, contemplates the use of a modified image reversal process as disclosed in U.S. Pat. No. 4,104,070 with longer exposure times to form gaps on a wafer substrate narrower than the width of the opaque areas of the mask.

SUMMARY OF THE INVENTION

It is an object of the present invention to provide a method for electrically isolating active components on a semiconductor substrate.

Another object of the present invention is to provide a method for fabricating isolation widths on a semiconductor substrate narrower than those achievable through the use of conventional photo-lithography.

Still another object of the present invention is to provide a photolithographic method for producing a resolvable line width of the order of about 1.0 to 2.0 microns on a semiconductor substrate utilizing conventional photolithography.

A further object of the present invention is to provide narrow width recessed oxide isolation areas for isolating devices and regions in memory and logic chips.

Other objects of the present invention will be apparent to the skilled artisan.

In accordance with the present invention, there is provided a process for forming very narrow resolvable line widths on a surface of a semiconductor substrate by combining the use of a positive working photoresist material to produce a negative photoresist image with initial overexposure of the photoresist through a mask to not only expose the portions of the photoresist corresponding to the transparent areas of the mask but to also expose portions of the photoresist along the outer periphery of the areas of the photoresist corresponding to the opaque areas of the mask. In this manner, through subsequent processing and development, the areas of the photoresist generally corresponding to the opaque areas of the mask, but narrower than said opaque areas of the mask, are removed to provide extremely narrow exposed widths on the semiconductor substrate, or a layer thereon. Utilizing the overexposure technique provides an improvement in image tolerance and control not generally available in other negative resist techniques.

More particularly, in accordance with the present invention, a narrow width area is provided on a semiconductor substrate by coating a layer of a positive working photoresist, preferably of the type including naphthoquinone (1,2) diazide sulfonic acid ester sensitizer and a 1-hydroxyethyl-2-alkylimidazoline, on the substrate, imagewise exposing the layer through a mask having transparent and opaque regions with actinic radiation of sufficient intensity and for a sufficient time to obtain said imagewise exposure and also to expose the outer peripheral areas of the portions of the photoresist corresponding to the opaque areas of the mask, heating the imagewise exposed layer for a sufficient period of time to a sufficient temperature to render the exposed areas insoluble in developer, subsequently blanket exposing the entire photoresist layer with actinic radiation and then removing the portions of the layer which were not exposed, thereby providing removed areas on said substrate narrower, of smaller surface area, than the opaque portions of said mask.

In a preferred embodiment of the present invention, recessed oxide isolation regions are formed on a surface of a semiconductor substrate by forming an insulating layer on the surface of the semiconductor substrate, carrying out the above-disclosed "over-exposure" followed by a negative working of a positive working photoresist having opaque regions corresponding to recessed oxide isolation regions, etching said insulating layer under the removed areas of said mask to uncover corresponding areas on the semiconductor substrate and oxidizing the uncovered portions of said semiconductor substrate.

Other embodiments and variations of the invention will be apparent to the skilled artisan from the Detailed Description of the Invention, hereinafter.

DETAILED DESCRIPTION OF THE INVENTION

Figure 1:
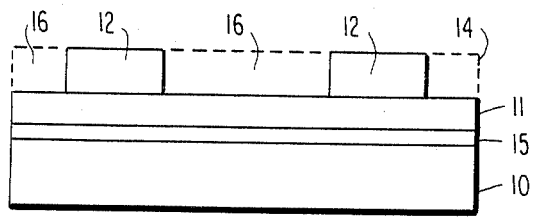
FIG. 1 is a cross-sectional view of a substrate which includes a photoresist and a mask.
Figure 2:
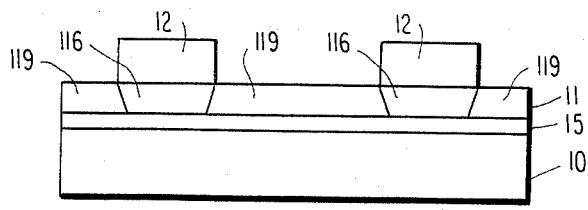
FIG. 2 is a cross-sectional view of the substrate of FIG. 1 after overexposure.
Figure 3:
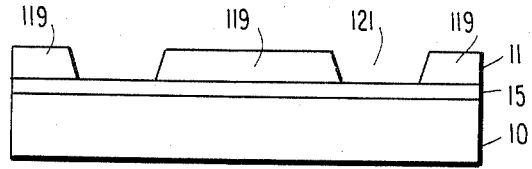
FIG. 3 is a cross-sectional view of the substrate of FIG. 2 after development.
Figure 4:
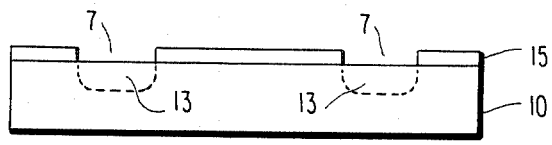
FIG. 4 is a cross-section view of the substrate of FIG. 3 after oxide growth and subsequent removal of the photoresist layer.

Although the invention will be described in detail with respect to the formation of recessed oxide isolation areas in semiconductor substrates, it will be apparent to the skilled artisan that the present invention can be used for formation of narrow gaps on chips or wafers for other purposes, such as minimum dimension contact holes, etching separations between polysilicon or metal films, and the like.

Turning to the Drawing, semiconductor substrate 10 carrying insulating layer 15, for example $Si_3N_4$, is coated with photoresist 11, which is a positive working photoresist of the type processable as described in U.S. Pat. No. 4,104,070 to provide a negative photoresist image. Mask 14 composed of transparent areas 16 and opaque areas 12 overlays the photoresist. Opaque lines 12 are essentially the narrowest width which can be formed through conventional near-UV projection photolithography, say about 2.0 to 3.0 microns. Recessed oxide isolation regions are to be formed in semiconductor substrate 10 at areas corresponding to but not appreciably wider than opaque mask areas 12. Photoresist 11 is exposed by actinic radiation through mask 14. The areas of the photoresist coextensive with transparent area 16 are exposed. Since photoresist 11 is a positive working photoresist, these areas coextensive with the transparent portions of the mask are removable by liquid developer. However, in accordance with the modified image reversal process of Moritz et al U.S. Pat. No. 4,104,070, prior to application of the developer, the imagewise exposed photoresist is heated to render the exposed areas 119 insoluble in the liquid developer. Thereafter, the areas 116 of the photoresist previously unexposed (roughly corresponding to the opaque areas 12 of the mask) are exposed, such as by removal of the mask 14 followed by blanket exposure of the entire photoresist 11. Then, the liquid developer is applied, which removes areas 116 of the photoresist, leaving areas 119. Gaps 121 are narrower than opaque areas 12. The remainder of the process is conventional, involving the removal of areas of insulating layer 15 which are not protected by the photoresist, such as by standard etching treatment. This results in exposure of areas 7 of the semiconductor substrate. Finally, the areas 7 of the substrate are oxidized to provide recessed oxide isolation regions 13 in the semiconductor substrate.

In the present invention, the first exposure of the photoresist 11 through mask 14 is carried out under exposure conditions to significantly overexpose photoresist areas 119. For example, 1.5 to 2.0 times the actinic radiation routinely employed can be used without altering time of exposure or the time of exposure can be lengthened, without altering the intensity of energy source. The degree of "overexposure" is selected so that the peripheral areas of photoresist 11 coextensive with the periphery of opaque areas 12 of the mask are exposed to the actinic radiation. This means that the area of photoresist 11 which is exposed will be slightly wider than the width of transparent area 16. In turn, this means that areas 116 of the photoresist which are later exposed, will be narrower than opaque areas 12 of the mask. The degree of image size shrinkage can be controlled by the extent of over exposure. For example, it has been found that although the opaque area 12 is 2 microns in width, through the use of the present invention, a resist opening of 1.5 microns in width can be made. This results in a typical recessed oxide isolation region 13 of 2.6 microns in width as compared to 3.1 microns in width.

Using a Perkin-Elmer "micralign" apparatus, such as the PMA 100 Series, the usual time of exposure of the wafer can be approximately doubled to practice the present invention. Sufficient "overexposure" occurs where the total width of the exposed portion of the photoresist is wider than the corresponding transparent area of the mask, preferably about 0.5 to 1.0 microns wider. The photoresists usable herein are the positive photoresists which can be converted to negative working materials during processing. In Moritz et al U.S. Pat. No. 4,104,070, a positive working photoresist comprising a phenol-formaldehyde resin with a naphthaquinone(1,2)diazide sulfonic acid ester sensitizer (such as AZ-1350 H photoresist of Shipley Co., Inc., Newton, Mass.) is used to which 1 weight percent of Monazoline C (Mona Ind., Inc., Patterson, N.J.) as a typical 1-hydroxyethyl-2-alkyl ($C_7$–$C_{17}$) imidazoline is added. Alkaline developers based on sodium hydrogen phosphate, sodium metasilicate, sodium hydroxide, and the like can be used, such as AZ-Developer of Shipley, Co., Inc.

Variations of the invention will be apparent to the skilled artisan. For example, a Shipley AZ 1350 J positive photoresist can be modified by addition of many types of basic compounds, strong or weak, such as potassium hydroxide, sodium hydroxide, tetramethylammonium hydroxide, etc. to prepare a modified photoresist which can be processed as described above. As an alternative sequence, an un-modified positive photoresist such as Shipley AZ-1350 J can be applied and exposed through a positive mask and then exposed to ammonia vapor, such as gaseous ammonia, either in the presence of heat, or followed by a heating step, to render the exposed areas less soluble in alkaline developer than the originally unexposed areas. Thereafter, blanket exposure is carried out followed by developing with an alkaline developer.

We claim:

1. A method of forming recessed oxide isolation regions on a surface of a semiconductor substrate comprising the steps of:
   (1) forming an insulating layer on the surface of said semiconductor substrate;
   (2) coating said insulating layer with a layer of positive-working photoresist which can be modified to provide a negative image;
   (3) imagewise exposing said photoresist through a mask having opaque regions at locations corresponding to said recessed oxide isolation locations on said substrate and having transparent regions corresponding to locations not corresponding to said recessed oxide isolation locations on said substrate under exposure conditions so as to 50 to 100% overexpose the portions of said photoresist coextensive with said transparent regions and the pheriphery of the areas of the photoresist corresponding to the opaque regions of said mask;
   (4) treating the exposed areas of said photoresist to render them insoluble in a developer, thereafter blanket exposing the photoresist layer and then removing, by developing, the areas of the photoresist which were not imagewise exposed during the exposure of step (3);
   (5) etching the regions of said insulating layer corresponding to the removed portions of said mask to thereby uncover the corresponding portions of the semiconductor substrate; and
   (6) oxidizing the uncovered portions of said semiconductor substrate to provide said recessed oxide isolation regions.

2. The method of claim 1 wherein said positive working photoresist consists essentially of a phenolformaldehyde resin, a naphthoquinone(1,2)diazide sulfonic acid ester sensitizer and a 1-hydroxyethyl-2-alkylimidazoline.

3. The method of claim 1 wherein step (4) of claim 1 comprises
   (A) heating the imagewise exposed layer for a sufficient period of time to a sufficient temperature to render the exposed areas insoluble in alkaline developer;
   (B) subsequently blanket exposing the photoresist layer with actinic radiation and
   (C) removing the portions of the photoresist layer which were not exposed during the imagewise exposure with an alkaline developer.

4. The method of claim 2 wherein step (4) of claim 1 comprises
   (A) heating the imagewise exposed layer for a sufficient period of time to a sufficient temperature to render the exposed areas insoluble in alkaline developer;
   (B) subsequently blanket exposing the photoresist layer with actinic radiation and
   (C) removing the portions of the photoresist layer which were not exposed during the imagewise exposure with an alkaline developer.

5. The method of claim 1 wherein the positive-working photoresist is a photoresist modified by the addition of a basic compound so as to provide a negative photoresist image on a substate.

6. The method of claim 1 wherein an unmodified positive photoresist, after imagewise exposure, is treated by ammonia vapor, in the presence of heat or followed by a heating step, to render the imagewise exposed areas less soluble in alkaline developer than the originally unexposed areas of the photoresist.

* * * * *